United States Patent [19]
Sichanugrist et al.

[11] Patent Number: 5,298,087
[45] Date of Patent: Mar. 29, 1994

[54] PHOTOVOLTAIC DEVICE USEFUL AS A MIRROR

[75] Inventors: Porponth Sichanugrist; Norimitsu Tanaka, both of Tokyo, Japan

[73] Assignee: Showa Shell Sekiyu K.K., Tokyo, Japan

[21] Appl. No.: 979,456

[22] Filed: Nov. 20, 1992

Related U.S. Application Data

[63] Continuation of Ser. No. 699,537, May 14, 1991, abandoned.

[30] Foreign Application Priority Data

May 15, 1990 [JP]  Japan ................... 2-123070

[51] Int. Cl.$^5$ ............... H01L 31/05; H01L 31/052
[52] U.S. Cl. ................... 136/249; 136/244; 136/256; 136/258
[58] Field of Search .............. 136/244, 249 MS, 256, 136/258 AM

[56] References Cited

U.S. PATENT DOCUMENTS

| | | | |
|---|---|---|---|
| 4,281,208 | 7/1981 | Kuwano et al. | 136/249 |
| 4,532,371 | 7/1985 | Hanak et al. | 136/249 MS |
| 4,772,933 | 9/1988 | Schade | 357/63 |
| 4,782,376 | 11/1988 | Catalano | 357/30 |
| 4,936,924 | 6/1990 | Inuzuka | 136/249 MS |

FOREIGN PATENT DOCUMENTS

| | | | |
|---|---|---|---|
| 2577716 | 8/1986 | France | 136/244 |
| 56-51879 | 5/1981 | Japan | 136/258 AM |
| 56-51880 | 5/1981 | Japan | 136/244 |
| 59-29475 | 2/1984 | Japan | 136/258 AM |
| 59-224182 | 12/1984 | Japan | 136/258 AM |

OTHER PUBLICATIONS

English Language Abstract of JP-A-56-51879, May 9, 1981.
English Language Abstract of JP-A-56-51880, May 9, 1981.
*21st Intersociety Energy Conversion Engineering Conference,* Aug. 29, 1986, pp. 1300–1303, Weber et al.
*Solar Cells,* vol. 13, No. 3, Jan. 1985, pp. 265–269, Madan et al.
Patent Abstracts of Japan, Abstract of JP-A 60-240,163, Nov. 29, 1985.

*Primary Examiner*—Aaron Weisstuch
*Attorney, Agent, or Firm*—Sughrue, Mion, Zinn, Macpeak & Seas

[57] ABSTRACT

A photovoltaic device that comprises an insulating transparent substrate coated with a light-receiving surface electrode formed of a thin metal film which in turn is overlaid with an amorphous semiconductor layer and a back electrode, said thin metal film being adapted for use as a mirror.

2 Claims, 2 Drawing Sheets

PHOTOVOLTAIC DEVICE USEFUL AS A MIRROR

This is a continuation of application Ser. No. 07/699,537 filed May 14, 1991, now abandoned.

FIELD OF THE INVENTION

This invention relates to photovoltaic devices for use in solar cells, photosensors and other applications. More specifically, this invention relates to photovoltaic devices that are advantageously used in such applications as where the surface electrode is utilized as a mirror.

BACKGROUND OF THE INVENTION

A conventional amorphous silicon solar cell system comprises a plurality of unit solar cells that are formed by superposing transparent electrodes, amorphous silicon (a-Si) film regions and back electrodes on a single glass substrate. The individual unit solar cells are connected in series in such a manner that the back electrode of one unit cell contacts the transparent electrode of an adjacent unit cell via a conductive path.

Solar cells are inherently designed to utilize the electric energy directly converted from sunlight and no considerations have been made to adapt solar cells to applications that have nothing to do with this photovoltaic conversion of sunlight to electricity. Since conventional solar cells use tin oxide or indium-tin oxide in transparent electrodes, their reflectance is too low to enable use as mirrors (for the reflectance of $SnO_2$ as compared to metals, see FIG. 2).

Another problem with the prior art is the difficulty involved in attempts at reducing the cost of materials. Currently, thin films of tin oxide or indiumtin oxide are deposited by a thermal CVD process or sputtering but this requires the use of not only expensive oxide targets but also a complicated sputtering apparatus such as one using a radio-frequency magnetron.

SUMMARY OF THE INVENTION

An object, therefore, of the present invention is to provide a photovoltaic device that is useful not only as a solar photovoltaic cell but also as a mirror.

This object of the present invention can be attained by a photovoltaic device that comprises an insulating transparent substrate coated with a light-receiving surface electrode formed of a thin metal film which in turn is overlaid with an amorphous semiconductor layer and a back electrode, which thin metal film is adapted for use as a mirror.

In a preferred embodiment, the thin metal film is formed of aluminum or nickel.

The use of a thin metal film as the surface electrode eliminates the need to heat the substrate and permits the use of not only an inexpensive metal target but also the formation of a desired surface electrode with a simple sputtering apparatus, whereby the materials cost can be reduced. Further, the thin metal film has a sufficiently high reflectance to be used as a mirror.

DETAILED DESCRIPTION OF THE INVENTION

An embodiment of the present invention is described below with reference to FIG. 1 which shows the sequence of major steps for fabricating the photovoltaic device of the present invention.

Figure 1A:
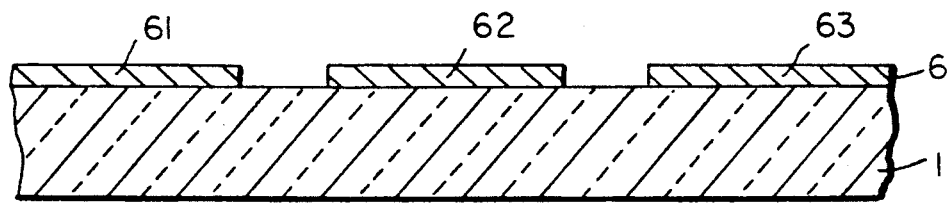
FIGS. 1(a)-1(d) show the sequence of major steps for fabricating the photovoltaic device of the present invention.

First, as shown in FIG. 1(a), a thin film of Al or Ni not thicker than 200 Å is deposited on a glass substrate 1 by DC sputtering to form a thin-film metal electrode 6. DC sputtering may be performed at an argon pressure of 5 Torr with a power of 0.17-0.65 kV being applied.

In the next step, the thin-film metal electrode is irradiated with a YAG laser operating at a wavelength of 1.06 $\mu$m to form a plurality of surface electrodes 61-63.

Figure 1B:
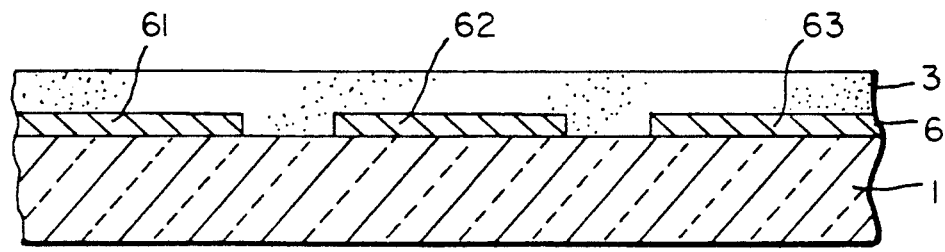

Then, as shown in FIG. 1(b), an a-Si film 3 having a pin junction is formed in a thickness of ca. 0.8 $\mu$m by a plasma-assisted CVD process.

Figure 1C:
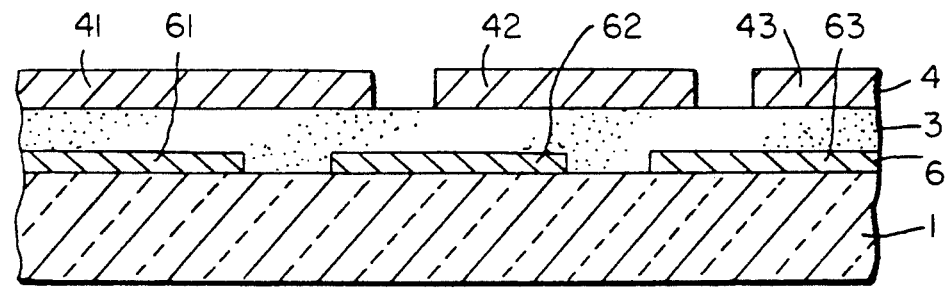
Figure 1D:
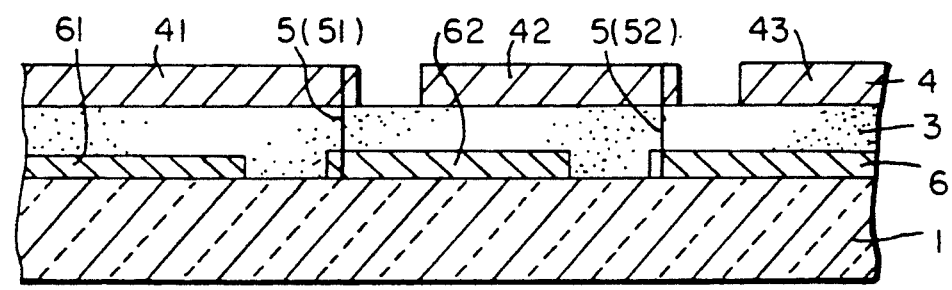

Subsequently, as shown in FIG. 1(c), a patterned metallic back electrode or conductive printed electrode 4 is formed in such a manner that it partly overlaps an adjacent thin-film metal electrode 6 via the a-Si film 3. The two overlapping electrode portions allow for interconnection between adjacent unit solar cells. One method for establishing interconnection between adjacent unit solar cells was already proposed in commonly assigned JP-A-2-268472 (the term "JP-A" as used herein means an "unexamined published Japanese patent application"). According to this method, a laser beam emitting at 1.06 $\mu$m is applied to the overlapping electrode portions from the substrate back side, whereupon the thin-film metal electrode 6 and the a-Si film 3 in each photovoltaic region and the back electrode 4 in an adjacent photovoltaic region are heated to melt, forming a conductive path (51 or 52) made of the resulting alloy layer. This conductive channel permits the back electrodes 41 and 42 to be connected respectively to thin-film metal electrodes 62 and 63, thereby producing an a-Si solar cell system in which the individual unit solar cells are connected in series, as shown in FIG. 1(d).

Figure 2:
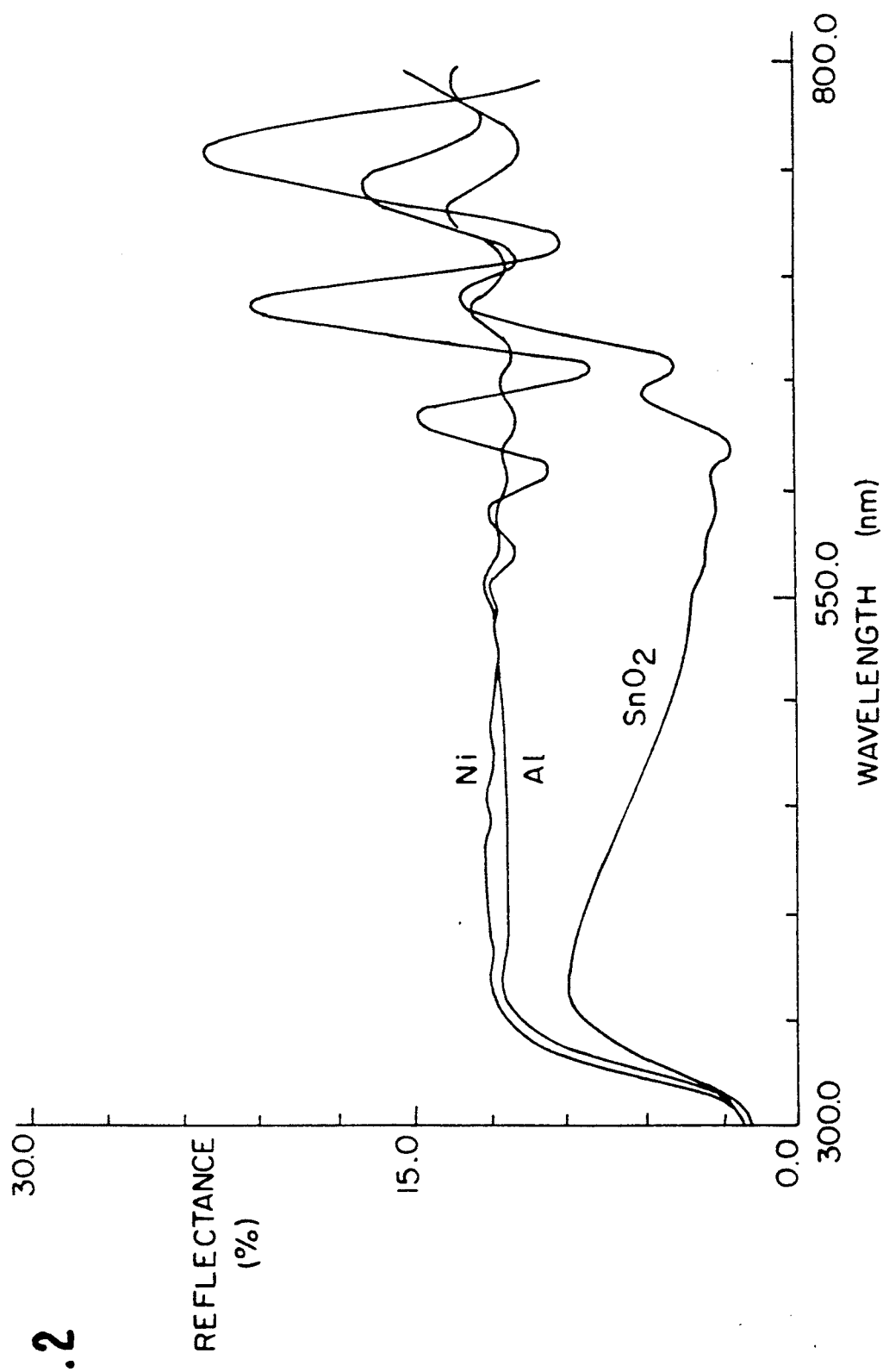
FIG. 2 is a graph showing the reflectance characteristics of three types of solar cells using $SnO_2$, Al, and Ni films, respectively, in the surface electrode.

The solar cell system constructed in the embodiment under consideration had a very high conversion efficiency as demonstrated by an efficiency of 4.7% for incident sunlight of 200 lux and 5.2% for 1,000 lux. When the surface electrode was formed of an Al or Ni film, the solar cell system had such a higher reflectance than when the conventional tin oxide film was used (see FIG. 2) and hence exhibited satisfactory performance as a mirror.

Therefore, when the solar cell system having the light receiving surface electrode formed of a thin metal film is incorporated in a hand-held electronic calculator, the latter can also be used as a mirror.

As described on the foregoing pages, the light receiving surface electrode in the photovoltaic device of the present invention is formed of a thin metal film and this eliminates the need to heat the substrate during the formation or light receiving surface electrodes, which therefore can be formed by a DC magnetron sputtering process with a simple apparatus and at high production rate. Further, the light receiving surface electrodes can be formed at a lower cost using inexpensive metal targets. As another advantage, the photovoltaic device of the present invention can also be used as a mirror, which contributes to the manufacture of commercial products of much added value that incorporate said photovoltaic device.

While the invention has been described in detail and with reference to specific embodiments thereof, it will be apparent to one skilled in the art that various changes and modifications can be made therein without departing from the spirit and scope thereof.

What is claimed is:

1. A photovoltaic device comprising an insulating transparent substrate coated with an incident light-receiving surface electrode formed of a thin metal filmof aluminum, said surface electrode overlaid with an amorphous semiconductor layer and a back electrode, said thin metal film being adapted for use as a mirror, and said thin metal film and said back electrode being connected by a conductive path, wherein said thin film and said back electrode are segmented to forma plurality of linearly arranged unit cells and the conductive path is between the back electrode of one unit cell and the thin metal film of an adjacent unit cell.

2. A photovolatic device according to claim 1, wherein said thin metal film is not thicker than 200 Å.

* * * * *